United States Patent
Yazawa et al.

(10) Patent No.: US 8,888,435 B2
(45) Date of Patent: Nov. 18, 2014

(54) INDUSTRIAL ROBOT WITH OVERLAPPING FIRST HAND AND SECOND HAND DURING TIME OF LINEAR TRANSPORT

(75) Inventors: Takayuki Yazawa, Nagano (JP); Yoshihisa Masuzawa, Nagano (JP); Takao Nakae, Nagano (JP)

(73) Assignee: Nidec Sankyo Corporation, Nagano (JP)

( * ) Notice: Subject to any disclaimer, the term of this patent is extended or adjusted under 35 U.S.C. 154(b) by 5 days.

(21) Appl. No.: 13/825,681

(22) PCT Filed: Sep. 6, 2011

(86) PCT No.: PCT/JP2011/070198
§ 371 (c)(1),
(2), (4) Date: Mar. 22, 2013

(87) PCT Pub. No.: WO2012/039274
PCT Pub. Date: Mar. 29, 2012

(65) Prior Publication Data
US 2013/0202390 A1    Aug. 8, 2013

(30) Foreign Application Priority Data

Sep. 24, 2010 (JP) ................. 2010-213334

(51) Int. Cl.
| | |
|---|---|
| *B66C 23/00* | (2006.01) |
| *B25J 9/06* | (2006.01) |
| *B25J 15/00* | (2006.01) |
| *H01L 21/687* | (2006.01) |
| *H01L 21/677* | (2006.01) |
| *B25J 9/04* | (2006.01) |

(52) U.S. Cl.
CPC ............. *B25J 15/0014* (2013.01); *B25J 9/06* (2013.01); *H01L 21/68707* (2013.01); *H01L 21/67742* (2013.01); *B25J 9/043* (2013.01); *Y10S 901/27* (2013.01)
USPC .......................................... 414/744.5; 901/27

(58) Field of Classification Search
CPC .......... B25J 9/06; B25J 9/0087; B25J 18/005; H01L 21/67703; H01L 21/67706; H01L 21/68707; H01L 21/68735; H01L 21/68785

USPC ................ 414/744.5, 744.6, 937; 901/27
See application file for complete search history.

(56) References Cited

U.S. PATENT DOCUMENTS

| | | | | | |
|---|---|---|---|---|---|
| 5,950,495 | A | * | 9/1999 | Ogawa et al. | 414/744.5 |
| 5,975,834 | A | * | 11/1999 | Ogawa et al. | 414/744.5 |
| 6,234,738 | B1 | * | 5/2001 | Kimata et al. | 414/937 |
| 6,364,599 | B1 | * | 4/2002 | Suwa et al. | 414/744.5 |
| 2009/0084215 | A1 | * | 4/2009 | Yazawa et al. | 294/116 |
| 2013/0202398 | A1 | * | 8/2013 | Watanabe et al. | 414/744.6 |

FOREIGN PATENT DOCUMENTS

| | | | |
|---|---|---|---|
| JP | 07-086371 | 3/1995 | |
| JP | 11207666 A | * 8/1999 | ............ B25J 9/06 |

(Continued)

OTHER PUBLICATIONS

International Search Report for PCT/JP2011/070198 dated Nov. 15, 2011.

*Primary Examiner* — Gerald McClain
(74) *Attorney, Agent, or Firm* — Frommer Lawrence & Haug LLP

(57) ABSTRACT

An industrial robot is provided with the first hand, the second hand, the arm and the main unit section. The base end portion of the first hand and the base end portion of the second hand are joined to the front end portion of the arm such that they overlap with each other in the top-bottom direction. The first hand and the second hand are independently rotatable with respect to the arm and also rotatable about the common center of rotation with respect to the arm in the view from the top-bottom direction. Also, the first hand and the second hand are formed being bent in the view from the top-bottom direction, and also formed to have line symmetry about a predetermined imaginary line passing through the center of rotation in the view from the top-bottom direction.

6 Claims, 4 Drawing Sheets

(56) References Cited

FOREIGN PATENT DOCUMENTS

| | | |
|---|---|---|
| JP | 2000-503478 | 3/2000 |
| JP | 2003-170382 | 6/2003 |
| JP | 2008-135630 | 6/2008 |
| JP | 2009-083031 | 4/2009 |
| JP | 2010-507221 | 3/2010 |

* cited by examiner

INDUSTRIAL ROBOT WITH OVERLAPPING FIRST HAND AND SECOND HAND DURING TIME OF LINEAR TRANSPORT The present application claims priority from PCT Parent Application No. PCT/JP2011/070198 filed on Sep. 6, 2011, which claims priority from Japanese Patent Application No. JP 2010-213334, filed on Sep. 24, 2010, the disclosures of which are incorporated herein by reference in their entirety.

FIELD OF THE INVENTION

The present invention relates to an industrial robot that transports objects to be transported, such as semiconductor wafers.

It is noted that citation or identification of any document in this application is not an admission that such document is available as prior art to the present invention.

Conventionally known as an industrial robot for transporting semiconductor wafers is one that has a device main unit, an arm, and two hands. (See Japanese Patent Application 2008-135630 Unexamined Publication ("JP 2008 135630"), for example.) in an industrial robot described in the JP 2008-135630, a base end portion of the arm is rotatably joined to the device main unit, and the two hands are joined to the front end portion of the arm such that their base end portions overlap with each other in the top and bottom direction. The two hands are independently rotatable with respect to the arm. Also, the two hands are formed in the same shape. More specifically, the base section of the hand is formed linearly, and the front end section of the hand is formed in a fork shape; the hand is formed in a Y-shape overall. Also, in this industrial robot, the arm extends out and folds in such that the base end portions of the hands joined to the area move linearly.

It is noted that in this disclosure and particularly in the claims and/or paragraphs, terms such as "comprises", "comprised", "comprising" and the like can have the meaning attributed to it in U.S. Patent law; e.g., they can mean "includes", "included", "including", and the like; and that terms such as "consisting essentially of" and "consists essentially of" have the meaning ascribed to them in U.S. Patent law, e.g., they allow for elements not explicitly recited, but exclude elements that are found in the prior art or that affect a basic or novel characteristic of the invention.

It is further noted that the invention does not intend to encompass within the scope of the invention any previously disclosed product, process of making the product or method of using the product, which meets the written description and enablement requirements of the USPTO (35 U.S.C. 112, first paragraph) or the EPO (Article 83 of the EPC), such that applicant(s) reserve the fight to disclaim, and hereby disclose a disclaimer of, any previously described product, method of making the product, or process of using the product.

SUMMARY OF THE INVENTION

In the industrial robot described in the patent invention 1, the two hands are independently rotatable with respect to the arm; therefore, it is possible that the two hands are arranged such that they overlap with each other in the top and bottom direction and such that other sections besides the base end portions of the hands joined to the arm do not overlap in the top and bottom direction. Therefore, this industrial robot is capable of taking out two semiconductor wafers simultaneously from a storing location in which the semiconductor wafers are stacked up in the top and bottom direction or carrying two semiconductor wafers simultaneously into the storing location, and also carrying two semiconductor wafers simultaneously to work location at which the semiconductor wafers are arranged so they are not overlapping with each other in the top-bottom direction or taking out two semiconductor wafers simultaneously from this work location.

However, there may be a gate section having openings, through which each of the two semiconductor wafers passes, between the industrial robot and the work location at which the semiconductor wafers are arranged so they are not overlapping with each other. If a gate section is arranged between the work location and the industrial robot, when one attempts to transport two semiconductor wafers with respect to the work station with the industrial robot described in the JP 2008-135630, the base end sections of the hands formed in an Y shape interfere with the wall sections between the openings, preventing the semiconductor wafers from being transported through the openings. The length of the base end side of the hand formed linearly may be made longer to prevent the interference between the base end side of the hand and the wall section; however, if the length of the base end side of the hand is made longer, the turning radius of the hand turning with the arm becomes larger with respect to the device main unit accordingly.

Then, an objective of the present invention is to provide an industrial robot capable of transporting objects to be transported with respect to a first arrangement location at which the objects to be transported are arranged overlapping with each other in the top-bottom direction and capable of transporting objects to be transported with respect to a second arrangement location at which the objects to be transported are arranged so they are not overlapping with each other, and capable of preventing the interference of the hands with the gate section while the turning radius of the hand with respect to the main unit section is reduced.

To achieve the above-mentioned objectives, an industrial robot of the present invention is provided with first and second hands on which objects to be transported are loaded, an arm to which the first and the second hand are rotatably joined, and a main unit to which a base end portion of the arm is rotatably joined; wherein a base end portion of the first hand and a base end portion of the second hand are joined to the front end portion of the arm such that they overlap with each other in the top bottom direction, and the first hand and the second hand are independently rotatable with respect to the arm and also rotatable about the common center of rotation with respect to the arm in the view from the top-bottom direction; and they are formed being bent in the view from the top-bottom direction and also formed having line symmetry about a predetermined imaginary line passing through the center of rotation in the view from the top-bottom direction.

In the present invention, keeping the front end side of the first hand and the front end side of the second hand overlapped with each other in the top-bottom direction, the industrial robot takes out an object to be transported from the first arrangement position, at which the objects to be transported are arranged overlapping with each other in the top-bottom direction, and/or carries the objects to be transported to the first arrangement location; keeping the front end side of the first hand and the front end side of the second hand not overlapped with each other, the robot takes out objects to be transported from the second arrangement location, at which the objects to be transported are arranged so they are not overlapping with each other in the top-bottom direction, and/or carries the objects to be transported to the second arrangement location.

In the industrial robot of the present invention, the base end portion of the first hand and the base end portion of the second hand are joined to the front end portion of the arm such that they overlap with each other in the top-bottom direction. Also, the first hand and the second hand are independently rotatable with respect to the arm and also rotatable about the common center of rotation with respect to the arm in the view from the top-bottom direction. Therefore, the transporting of objects to be transported to the first arrangement location, in which the objects to be transported are arranged overlapping with each other in the top-bottom direction, is made possible by arranging the two hands (the first and second hands) in such a way that the front end portion of the first hand and the front end portion of the second hand, on which objects to be transported are loaded, overlap with each other in the top-bottom direction; the transporting of the objects to be transported to the second arrangement location, in which the objects to be transported are arranged so they are not overlapping with each other in the top-bottom direction, is made possible by arranging the second hand in such way that the front end portion of the first hand and the front end portion of the second hand do not overlap with each other in the top-bottom direction.

Also, in the present invention, the first hand and the second hand are both formed being bent in the view from the top-bottom direction, and also formed having line symmetry about a predetermined imaginary line passing through the center of rotation in the view from the top-bottom direction. Therefore, even if there is a gate arranged between the industrial robot and the second arrangement location, the first hand and the second hand can he prevented from interfering with the gate section by bending the first hand and the second hand into a predetermined shape while the length of the first hand and the second hand of the industrial robot in the radial direction are shortened. In other words, in the present invention, even if a gate section is arranged between the industrial robot and the second arrangement location, the hands can be prevented from interfering with the gate section while the turning radius of the hand with respect to the main unit is minimized.

In the present invention, it is preferred that the first hand and the second hand be formed such that the base section of the first hand and the base section of the second hand extend from the center of rotation toward the directions to part from each other during the time of transporting the objects to be transported to the second hand arrangement location. With this configuration, the gap between the first hand and the second hand can be increased during the rime of transporting the objects to be transported with respect to the second arrangement location. Therefore, the first hand and the second hand can be easily prevented from interfering with the gate section.

For this case, the first hand and the second hand are formed such that the bending section of the first hand and the bending section of the second hand are positioned outside the triangle area which is bordered by a line connecting the center of the object to be transported when loaded on the first hand with the center of rotation and a line connecting the center of the object to be transported when loaded on the second hand with the center of rotation, during the time of transporting the objects to be transported with respect to the second arrangement location.

In the present invention, the first hand and the second hand are formed such that the front end side of the first hand and the front end side of the second hand overlap crossing over each other during the time of transporting the objects to be transported with respect to the first arrangement location. For this case, it is preferred that the first hand be formed being bent in one direction in the view from the top-bottom direction, and the second hand be formed being bent in the direction opposite the bending direction of the first hand; the front end side of the first hand and the front end side of the second hand be forked providing a first loading section and a second loading section respectively; the first loading section of the first hand be arranged on the bending direction side of the first hand, and the second loading section of the first hand be arranged on the side opposite the bending direction side of the first hand; the first loading section of the second hand be arranged on the bending direction side of the second hand, and the second loading section of the second hand be arranged on the side opposite the bending direction side of the second hand; and the first hand and the second hand be formed such that the front end portion of the second loading section of the first hand overlaps with the front end portion of the second loading section of the second hand during the time of transporting the objects to be transported with respect to the first arrangement location. With this configuration, the overlapping width between the first hand and the second hand in the direction in which they intersect orthogonally with the transporting direction during the time of transporting objects to be transported with respect to the first arrangement position, can be minimized. For this reason, even when a gate section having an opening for the objects to be transported to pass through is arranged between the industrial robot and the first arrangement position, interference between the gate section and the bent hands can be prevented.

In the present invention, it is preferred that the first hand and the second hand be formed being bent once at a predetermined angle in the view from the top-bottom direction. In this way, the configuration of the first hand and the second hand can be simplified, unlike the configuration in which the first hand and the second hand are bent multiple times in the view from the top-bottom direction.

In the present invention, it is preferred that the width of the front end side of the first hand be more uniform than its bending section and likewise the width of the front end side of the second hand be more uniform than its bending section. Configured in this way, the width of the first hand and the width of the second hand to the direction in which they intersect orthogonally with the transporting direction of the object to be transported can he minimized, unlike the configuration in which the width of the front end side of the first hand or the width of the front end side of the second hand is gradually widened toward the front end of each hand. Therefore, even when a gate section is arranged between the industrial robot and the second arrangement location or between the industrial robot and the first arrangement location, the interference between the gate and the hands can be prevented with certainty.

As described above, with the industrial robot of the present invention, the transporting of the objects to be transported is made possible with respect to the first arrangement location, at which the objects to be transported are arranged overlapping with each other in the top-bottom direction, and also the transporting of the objects to be transported is made possible with respect to the second arrangement location, at which the objects to be transported are arranged so as not to overlap with each other; and even when a gate section is arranged between the industrial robot and the second arrangement location, the interference between the hands and the gate section can be prevented while the turning radius of the hands with respect to the main unit section is minimized.

DETAILED DESCRIPTION OF EMBODIMENTS

It is to be understood that the figures and descriptions of the present invention have been simplified to illustrate elements that are relevant for a clear understanding of the present invention, while eliminating, for purposes of clarity, many other elements which are conventional in this art. Those of ordinary skill in the art will recognize that other elements are desirable for implementing the present invention. However, because such elements are well known in the art, and because they do not facilitate a better understanding of the present invention, a discussion of such elements is not provided herein.

The present invention will now be described in detail on the basis of exemplary embodiments.

Figure 1:
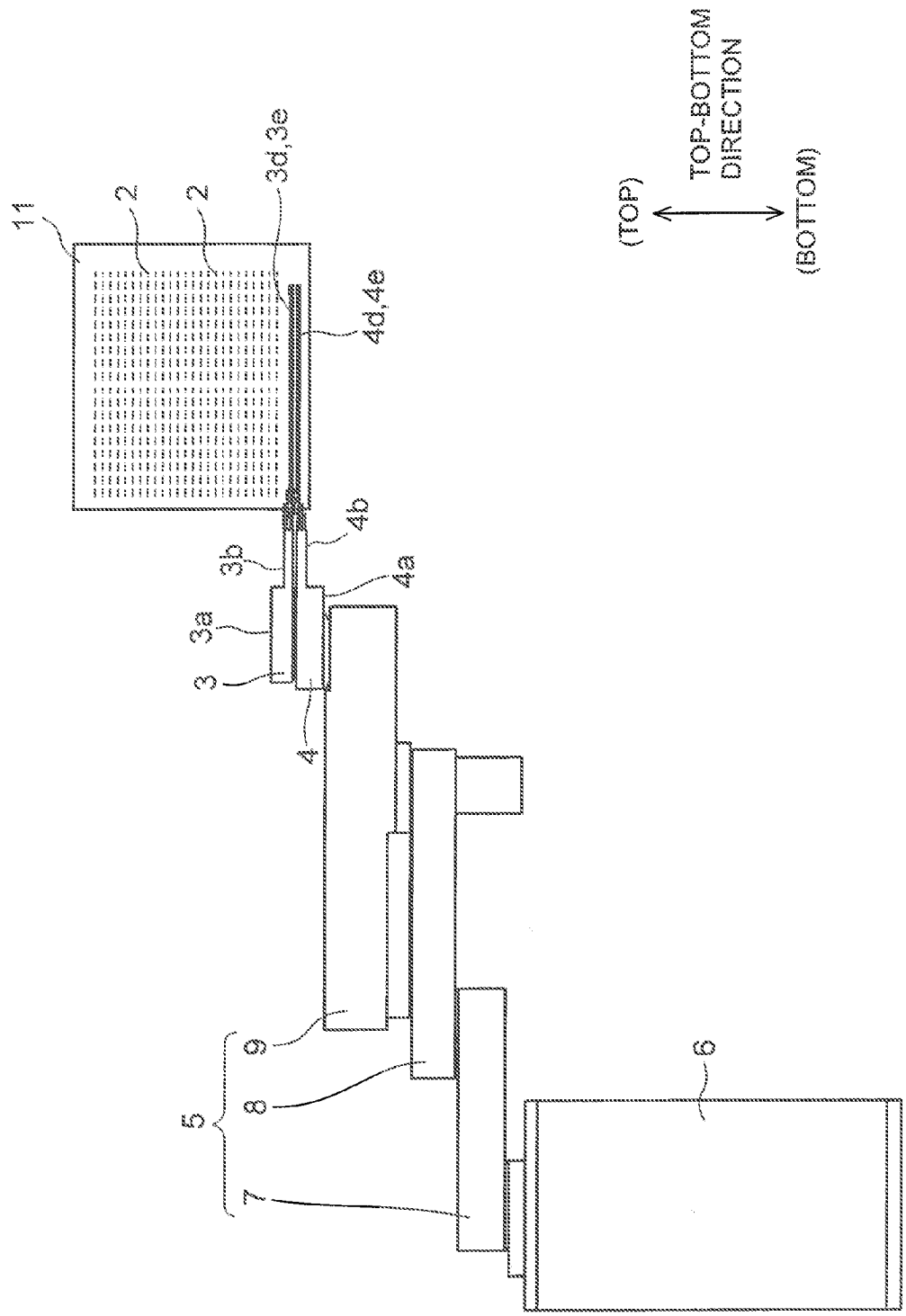
FIG. 1 is a side view of an industrial robot of an embodiment of the present invention.
Figure 2:
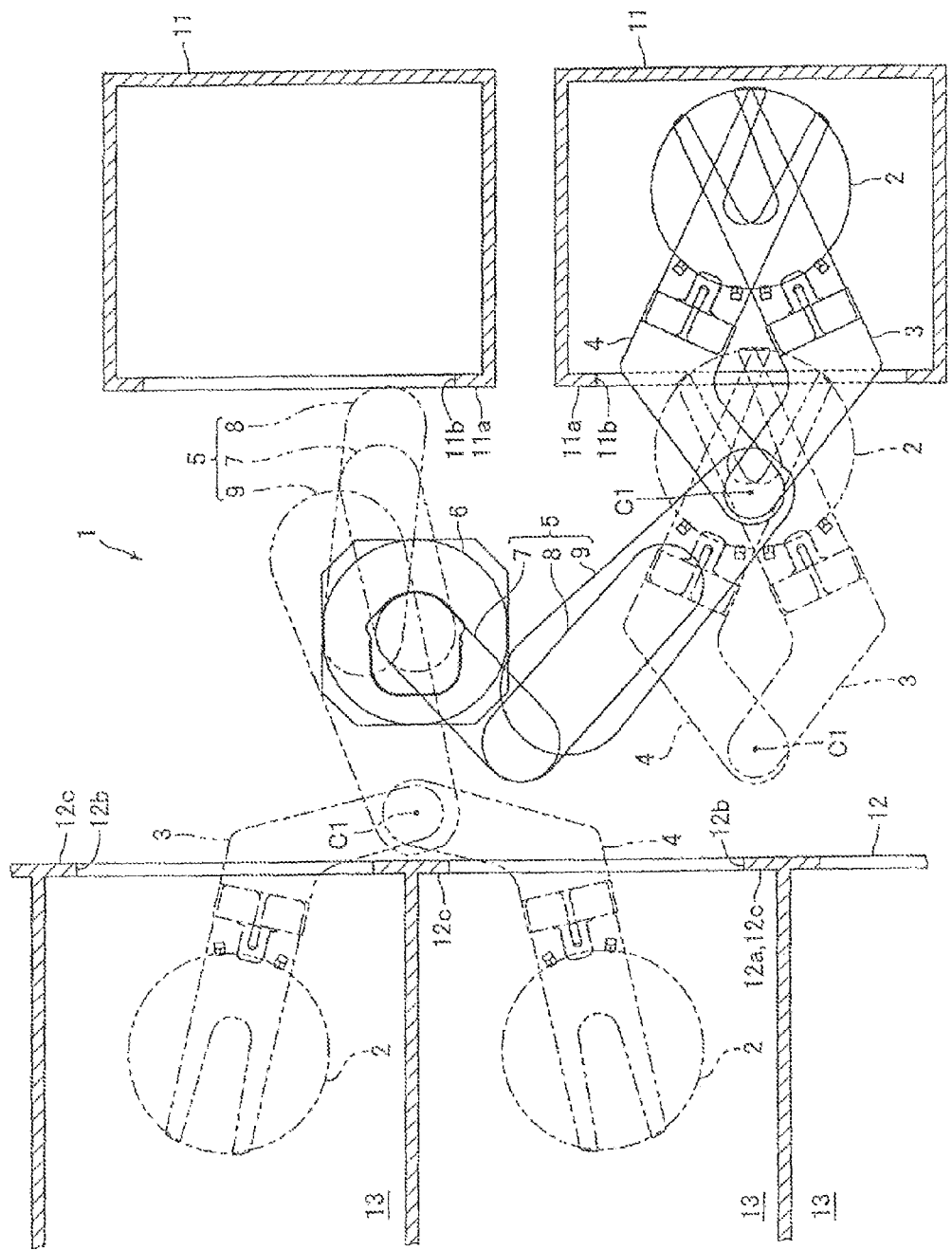
FIG. 2 is a plan view of the industrial robot shown in FIG. 1.

Configuration of Indusrial Robot:

FIG. 1 is a side view of an industrial robot I of an embodiment of the present invention. FIG. 2 is a plan view of the industrial robot shown in FIG. 1.

The industrial robot 1 of the present invention is an articulated robot for transporting semiconductor wafers (see FIG. 2) which are objects to be transported. As shown FIG. 1 and FIG. 2, the industrial robot is provided with a first hand 3 and a second hand 4 on which the semiconductor wafers 2 are loaded, an arm 5 to which the first hand 3 and the second hand 4 are rotatably joined, and a main unit 6 to which a base end portion of the arm 5 is rotatably joined. Note that the industrial robot 1 is denoted as "robot 1" and the semiconductor wafer 2 as "wafer 2" in the description below The main unit 6 is formed in a cylindrical shape. Inside the main unit, a lifting machine (illustration omitted) is stored to raise and lower the arm 5. The arm 5 is configured by a first arm section 7, a second arm section 8 and a third arm section 9. The first arm section 7, the second arm section 8 and the third arm section 9 are formed hollow The base end portion of the first arm section 7 is rotatably joined to the main unit 6. The bas end portion or the second arm section 8 is ratably joined to the front end portion of the first arm section 7. The base end portion of the third arm section 9 is rotatably joined to the front end portion of the second arm section 8. In this embodiment, the main unit 6, the first arm section 7, the second arm section 8 and the third arm section 9 are arranged in this order from the bottom to the top.

The base end portion of the first hand 3 and the base end portion of the second hand 4 are joined to the front end portion of the third arm section 9 such that they overlap with each other in the top-bottom direction. The base end portion of the first hand 3 and the base end portion of the second hand 4 are arranged on the top face of the third arm section 9. In this embodiment, the base end portion of the first hand 3 is arranged at top and the base end portion of the second had 4 is arranged at bottom, in other words, the first hand 3 is arranged above the second hand 4. The first hand 3 and the second hand 4 are independently rotatable with respect to the arm 5. Also, the first hand 3 and the second hand 4 are rotatable about the common center of rotation C1 in the view from the top-bottom direction. A detailed configuration of the first hand 3 and the second hand 4 is described later.

Also, the robot 1 is provided with a base-end-side arm section drive mechanism (illustration omitted) that extends out and folds in the base-end-side arm section, which consists of the first arm section 7 and the second arm section 8, by rotating the first arm section 7 and the second arm section 8, a third arm section drive mechanism (illustration omitted) that rotates the third arm section 9, a first hand drive mechanism (illustration omitted) that rotates the first hand 3, and a second hand drive mechanism (illustration omitted) that rotates the second hand 4.

The base-end-side arm section drive mechanism is provided with a motor, a reduction gear that decelerates the power of the motor and transmits it to the first arm section 7 and another reduction gear that decelerates the power of the motor and transmits it to the second arm section 8. The third arm section chive mechanism is provided with a motor and a reduction gear that decelerates the power of the motor and transmits it to the third arm section 9. The first hand drive mechanism is provided with a motor and a reduction gear that decelerates the power of the motor and transmits it to the first hand 3, and the second band drive mechanism is provided with a motor and a reduction gear that decelerates the power of the motor and transmits it to the second hand 4.

The robot 1 of this embodiment is installed and used in a semiconductor manufacturing system. For example, the robot 1 is positioned at the entrance of the semiconductor manufacturing system and transports wafers 2 between the cassette 11, in which wafers 2 are stacked up at a predetermined pitch in the top-bottom direction, and a processing device, in which wafers 2 are arranged so they do not overlap with each other in the top-bottom direction (see FIG. 2).

A gate section 11a is formed to the cassette 11. In the gate section 11a an opening 11b is created so that the front end sides of the first hand 3 and the second hand 4 pass through. In the processing device 12 multiple processing chambers 13 are formed next to each other. Also, a gate section 12a is formed in the processing device 12. In the gate section 12a multiple openings 12b individually leading to the processing chambers are created, and between the opening sections 12b is a wall 12c of the gate section 12b.

In this embodiment, the robot 1, keeping the front end side of the first hand 3 and the front end side of the second hand 4 overlapped with each other in the top-bottom direction, takes out two wafers 2 from the cassette 11 simultaneously or carries the two wafers 2 into the cassette 11 simultaneously. Also, the robot 1, keeping the front end side of the first hand 3 and the front end side of the second hand 4 so they are not overlapped with each other in the top-bottom direction, carries the two wafers 2 into the two processing chambers 13 individually but simultaneously or takes out the two wafers 2 from each of the two processing chambers 13 individually but simultaneously.

For transporting the wafers 2 with respect to the cassette 11 or transporting the wafers 2 with respect to the processing device 12, the arm 5 extends out and folds in such that the moving trace of the center of rotation C1 of the first hand 3 and the second hand 4 depicts a straight line. In this embodiment, the inside of the cassette 11 is a first arrangement location in which wafers 2, objects to be transported, are arranged overlapping with each other in the top-bottom direction, and the inside of the processing device 12 is a second arrangement location in which wafers 2 are arranged so as not to overlap with each other in the top-bottom direction. Note that, in this embodiment, the robot 1, keeping the front end side of the first hand 3 and the front end side of the second hand 4 in the position they are not overlapped with each other in the top-bottom direction, may take out one wafer 2 from the cassette 11 or carry one wafer 2 into the cassette 11.

Figure 3A:
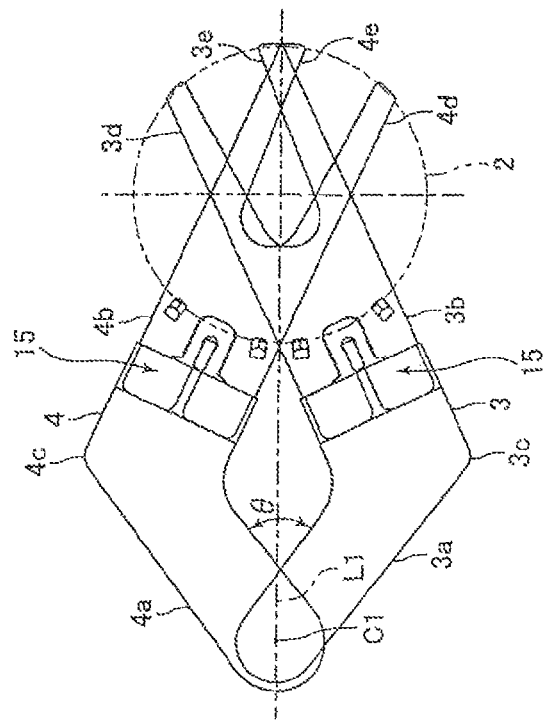
FIG. 3 is a plan view of a first hand and a second hand shown in FIG. 2: (A) shows the status of the first hand and the second hand during the time of transporting wafers with respect to a processing device; (B) shows the status of the first hand and the second hand daring the time of transporting wafers with respect to a cassette.
Figure 3B:
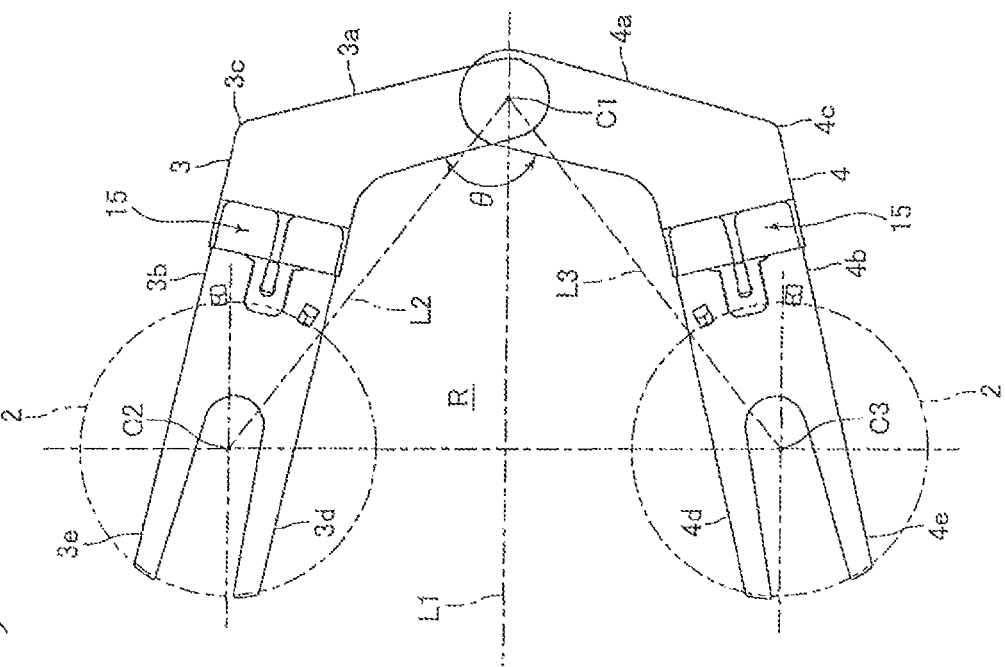

Configuration of First Hand and Second Hand:

FIG. 3 is a plan view of the first hand 3 and the second hand 4 shown in FIG. 2: (A) shows the status of the first hand 3 and the second hand 4 during the time of transporting wafers 2 with respect to the processing device 12; (B) shows the status of the first hand 3 and the second hand 4 during the time of transporting wafers 2 with respect to the cassette 11.

The first hand 3 and the second hand 4 are formed being bent in the view from the top-bottom direction. More specifically, the first hand 3 and the second hand 4 are bent once at a predetermined angle in the view from the top-bottom direction. Also, the first hand 3 and the second hand 4 are formed to have line symmetry about a predetermined imaginary line L1 passing through the center of rotation C1 in the view from the top-bottom direction. In other words, the first hand 3 and the second hand 4 are formed being bent in the opposite directions from each other; the first hand 3 is bent in one direction from its base end toward its front end (counterclockwise in FIG. 3) and the second hand 4 is bent in the other direction from its base end toward its front end (clockwise in FIG. 3).

The first hand 3 is configured by a base section 3a and a front section 3b. Also, the first hand 3 is bent once such that the angle created by the base section 3a and the front section 3b is an obtuse angle in the view from the top-bottom direction, and is formed in an L-shape (or in the shape of Japanese character "ku") as a whole. In the same manner, the second hand 4 is configured by a base section 4a and a front section 4b. Also, the second hand 4 is bent once such that the angle created by the base section 4a and the front section 4b is an obtuse angle in the view from the top-bottom direction, and is formed in an L-shape (or in the shape of Japanese character "ku") as a whole. The angle created by the base section 3a, 4a and the front section 3b, 4b is 120°, for example. The section at which the base section 3a, 4a and the front section 3b, 4b meet is given as a bending section 3c, 4c. Also, the wafer 2 is to be loaded on the front section 3b and 4b.

The thickness of the base section 3a, 4a (the thickness in the top-bottom direction) is more than that of the front section 3b, 4b. The width of the base section 3a, 4a is narrower than that of the front section 3b, 4b. Also, the width of the base section 3a, 4a is uniform and likewise the width of the front section 3b, 4b is uniform. Note that, in this embodiment, the width of the base section 3a is narrower than that of the base section 4a. On the other hand, the width of the front section 3b of the first hand 3 is equal to the width of the front section 4b of the second hand 4.

The front end side of the front section 3b, 4b is forked to provide a first loading section 3d, 4d and a second loading section 3e, 4e, each of which holds part of the wafer 2. The first loading section 3d is arranged on the bending direction side of the first band 3; the first loading section 4d is arranged on the bending direction side of the second hand 4. Also, the second loading section 3e is arranged on the opposite side from the bending direction side of the first hand 3, likewise the second loading section 4e is arranged on the opposite side from the bending direction side of the second hand 4. To the base end of the front end section 3b, 4b a gripping means 15 is arranged for clamping wafers 2. The gripping means 15 is configured by a contact section that makes contact with the edge surface of the wafer 2 and as cylinder that drives the contact section. Note that a suction-type wafer-holding means may be provided in place of the gripping means 15 configured by the cylinder, etc.

During the time of transporting wafers with respect to the processing device 12, the front end side of the first hand 3 and the front end side of the second hand 4 are not overlapped in die top-bottom direction, as described above. More specifically, the rotation positions of the first hand 3 and the second hand 4 are set such that the angle θ made by the base section 3a and the base section 4a is about 150° during the time of the transportation with respect to the processing device 12, as shown in FIG. 3 (A). In other words, during the time of transporting wafers 2 with respect to the processing device 12, the base section 3a and the base section 4b extend from the center of rotation C1 toward the directions in which they part from each other. Also, the front section 3b, 4b extend from the bending section 3c, 4c toward the processing device 12. During the time of transporting wafers 2 with respect to the processing device 12, as shown in FIG. 3 (A), the bending section 3c, 4c is positioned outside the triangle area R bordered by a tine L2 connecting the center, C2, of the wafer 2 loaded on the first hand 3 with the center of rotation, C1, and a line L3 connecting the center, C3, of the wafer 2 loaded on the second hand 4 with the center of rotation, C1.

On the other hand, during the time of transporting wafers 2 with respect to the cassette 11, the front end side of the first hand 3 and the front end side of the second hand 4 overlap with each other in the top-bottom direction, as described above. More specifically, the rotation positions of the first hand 3 and the second hand 4 are set such that the hands overlap with each other with the front end side of the front section 3b and the front end side of the front section 4b crossing over each other during the time of transporting wafers 2 with respect to the cassette 11, as shown in FIG. 3 (B). Even more specifically, the rotation positions of the first hand 3 and the second hand 4 and set such that the front end side of the second loading section 3e and the front end side of the second loading section 4e overlap with each other during the time of transporting wafers 2 with respect to the cassette 11. The angle θ created by the base section 3a and the base section 4a is about 70°, for example.

Figure 4A:
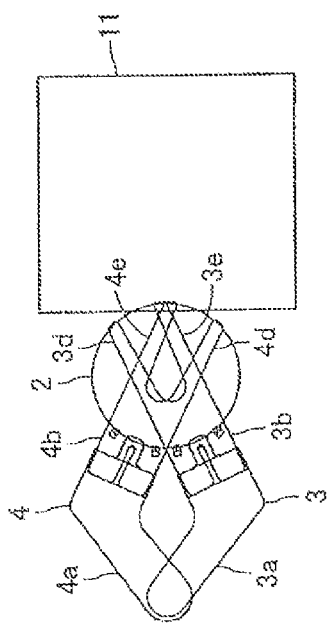
FIG. 4 is a plan view of the hands taking out the wafers with the front end of the first hand and the front end of the second hand in the position so they are not overlapping with each other in the top-bottom direction.
Figure 4B:
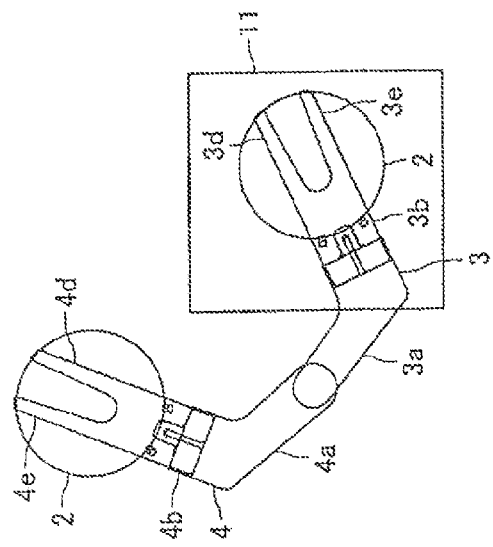
Figure 4C:
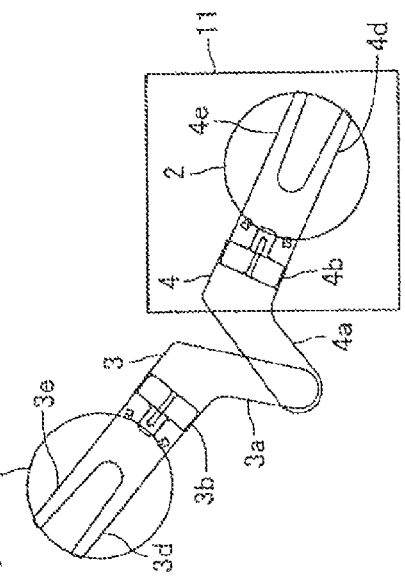

Motion of Industrial Robot:

FIG. 4 is a plan view showing that wafers 2 are taken out from the cassette 11 shown in FIG. 2 while the front end side of the first hand 3 and the front end side of the second hand 4 are not overlapped with each other in the top-bottom direction.

In the robot 1 configured as above, the arm 5 extends out and folds in keeping the front end side of the first hand 3 and the front end side of the second hand 4 overlapped with each other, as shown in FIG. 2, to take out two wafers 2 from the cassette 11 simultaneously. At that time, the front end side of the first hand 3 and the front end side of the second hand 4 pass through the opening 11b created in the gate section 11a of the cassette 11 keeping the front end sides of the first hand and second hand overlapped with each other.

Once the wafers 2 are taken out from the cassette 11, the first arm section 7, the second arm section 8 and the third arm section 9 are rotated at a predetermined angle, and also the first hand 3 and the second hand 4 are rotated so that the front end side of the first hand 3 and the front end side of the second hand 4 part from each other (more specifically, the first hand 3 is rotated clockwise in FIG. 2, and the second hand 4 is rotated counterclockwise in FIG. 2); then, the arm 5 extends out and folds in keeping the front end side of the first hand 3 and the front end side of the second hand 4 so they are not overlapped with each other, to carry two wafers 2 into the two processing chambers respectively but simultaneously. At that time, the front end side of the first hand 3 passes through one of the openings 12b created in the gate section 12a of the processing device 12 and the front end side of the second hand 4 passes through the other one of the openings 12b.

When a predetermined process is completed in the processing device 12, the arm 5 extends out and folds in, keeping the front end side of the first hand 3 and the front end side of the second hand 4 not overlapped with each other, and the two wafers 2 are taken out from the two processing chambers 13 respectively but simultaneously. Once the wafers 2 are taken out from the processing chambers 13, the first arm section 7, the second arm section 8 and the third arm section 9 are rotated at a predetermined angle, and also the first hand 3 and the second hand 4 are rotated so that the front end side of the first hand 3 and the front end side of the second hand 4 are overlapped with each other (more specifically, the first hand 3 is rotated counterclockwise in FIG. 2, and the second hand 4 is rotated clockwise in FIG. 2); then, the arm 5 extends out and folds in, keeping the front end of the first hand 3 and the front end of the second hand 4 overlapped with each other, to carry the two wafers 2 into the cassette 11 simultaneously.

Depending on the number of wafers 2 to be stored in the cassette 11, a single wafer 2 may be taken out from the cassette 11 or carried into the cassette 11 while the front end side of the first hand 3 and the front end side of the second hand 4 are not overlapped with each other in the top-bottom direction. In this case, the second hand 4 is rotated counterclockwise from the state in which the front end side of the first hand 3 and the front end side of the second hand 4 are overlapped with each other, until the base section 3a and the base section 4a make an obtuse angle, as shown in FIG. 4 (B), and then the arm 5 is extended out and folded in to transport the wafers 2 with respect to the cassette 11. Also, the first hand 3 is rotated counterclockwise in FIG. 4 from the state in which the front end side of the first hand 3 and the front end side of the second band 4 are overlapped with each other, until the base section 3a and the base section 4a make an acute angle as shown in FIG. 4 (C), and then the arm is extended out and folded in to transport the wafers 2 with respect to the cassette 11.

In the same manner, the second hand 4 may be rotated clockwise in FIG. 4 from the state in which the front end side of he first hand 3 and the front end side of the second hand 4 are overlapped with each other, until the base section 3a and the base section 4a make an acute angle, and then the arm 5 be extended out and folded in to transport the wafers 2 with respect to the cassette 11; or the first hand 3 may be rotated clockwise in FIG. 4 from the state in which the front end side of the first hand 3 and the front end side of the second hand 4 are overlapped, until the base section 3a and the base section 4a make an obtuse angle, and then the arm 5 be extended out and folded in to transport the wafers 2 with respect to the cassette 11.

Major Effects of this Embodiment:

As described above, in this embodiment, the base send portion of the first hand 3 and the base end portion of the second hand 4 are joined to the front end portion of the third arm section 9 such that they overlap with each other in the top bottom direction, and the first hand 3 and the second hand 4 are independently rotatable with respect to the arm 5. For this reason, as described above, by setting the rotation positions for the first hand 3 and the second hand 4 such that the front end side of the first hand 3 and the front end side of the second hand 4 overlap with each other, the transporting of two wafers 2 is made possible with respect to the cassette 11 in which wafers are stacked up; by setting the rotation positions for the first hand 3 and the second hand 4 such that the front end side of the first hand 3 and the front end side of the second hand 4 do not overlap with each other, the simultaneous transporting of two wafers 2 is made possible with respect to the two adjacent processing chambers 13. In other words, in this embodiment, two wafers can be transported simultaneously with respect to the cassette 11 and also with respect to the processing device 12. Therefore, in this embodiment, the cycle time can be shortened. Further, two wafers can be transported simultaneously in this embodiment; therefore, the number of motions of the robot 1 can be reduced, and consequently the life of the robot 1 can be extended.

In this embodiment, the first hand 3 and the second hand 4 are formed such that they are bent once at a predetermined angle in the opposite directions in the view from the top-bottom direction, and also formed to have line symmetry about an imaginary line L1 in the view from the top-bottom direction. During the time of transporting wafers 2 with respect to the processing device 12, the base section 3a and the base section 4a are extended from the center of rotation C1 toward the directions in which they part from each other. For this reason, even when the wall section 12c is arranged between the openings 12b in the gate section 12a created in the processing device 12, the interference between the first hand 3 and the second hand 4 and the wall section 12c can be prevented while the length of the first hand 3 and the second hand 4 of the robot 1 in the radial direction is reduced. in other words, in this embodiment, even when the wall section 12 is formed in the gate section 12a, the first hand 3 and the second hand 4 are prevented from interfering with the gate section 12a even while the turning radius of the first hand 3 and the second hand 4 with respect to the main unit 6 is minimized.

Also, in this embodiment, the rotation positions of the first hand 3 and the second hand 4 are set such that the front end portion of the second loading section 3e and the front end portion of the second loading section 4e overlap with each other during the time of transporting wafers 2 with respect to the cassette 11. Therefore, the overlapping width between the first hand 3 and the second hand 4 in the direction orthogonal to the transporting direction of wafers can be made smaller for the time of transporting the wafers 2 with respect to the cassette 11. Therefore, although the first hand 3 and the second hand 4 are bent in this embodiment, the gate section 11a of the cassette 11 and the first hand 3 and the second hand 4 are prevented from interfering with each other during the time of transporting wafers 2 with respect to the cassette 11.

Also, the width of the front section 3b of the first hand 3 and the width of the front section 4b of the second hand 4 is uniform in this embodiment therefore, the width of the first hand 3 and the width of the second hand 4 in the direction orthogonal to the transporting direction of wafers can be reduced unlike the configuration in which the front section 3b, 4b is gradually widened toward the front end. Therefore, in this embodiment, the first hand 3 and the second hand 4 are kept from interfering with the gate section 11a, 12a with more certainty, In this embodiment, the first hand 3 and the second hand 4 are formed being bent once in the view from the top-bottom direction. Therefore, unlike the configuration in which the first hand 3 and the second hand 4 are bent multiple times in the view from the top-bottom direction, the configuration of the first hand 3 and the second hand 4 can be more simple.

Other Embodiments:

The above described embodiment is one of the preferred examples of the present invention; however, the present invention is not limited to this, but can be varyingly modified within the scope of the invention.

In the above-described embodiment, the first hand 3 is bent such that the base section 3a and the front section 3b create an obtuse angle in the view from the top-bottom direction. Beside this, the first hand 3 may be bent such that the base section 3a and the front section 3b create a right angle or an acute angle in the view from the top-bottom direction. In the same manner, the second hand 4 is bent such that the base section 4a and the front section 4b create an obtuse angle in the view from the top-bottom direction in the above-described embodiment; however, the second hand 4 may be bent such that the base section 4a and the front section 4b create a right angle or an acute angle in the view from the top-bottom direction.

In the above-described embodiment, the first hand 3 and the second hand 4 are formed being bent once in the view from the top-bottom direction. Beside this, the first hand 3 and the second hand 4 may be formed being bent two times or more. Also, in the above-described embodiment, the width of the front section 3b of the first hand 3 and the width of the front section 4b of the second hand 4 are uniform; however, like the industrial robot described, in the above-described JP 2008-135630, the front section 3b, 4b may be formed such that the width thereof is gradually widened toward the front end.

In the above-described embodiment, the front section 3b of the first hand 3 and the front section 4b of the second hand 4 are forked. Beside this, the front section 3b, 4b may be formed in a straight line. Also, in the above-described embodiment, the robot 1 is a robot for transporting wafers 2; however, it may be a transporting robot that transports objects to be transported, such as substrates, other than wafers 2.

While this invention has been described in conjunction with the specific embodiments outlined above, it is evident that many alternatives, modifications, and variations will be apparent to those skilled in the art. Accordingly, the preferred embodiments of the invention as set forth above are intended to be illustrative, not limiting. Various changes may be made without departing from the spirit and scope of the inventions as defined in the following claims.

Description Of Codes

1 Robot (Industrial robot)
2 Wafer (Semiconductor wafer, Object to be transported)
3 First Hand
3c Bending Section
3d First Loading Section
3e Second Loading Section
4 Second Hand
4c Bending Section
4d First Loading Section
4e Second Loading Section
5 Arm
6 Main Unit
11 Cassette (First arrangement location)
12 Processing Device (Second arrangement location)
C1 Center of Rotation
C2 Center of an Object to be Transported, Loaded on the First Hand
C3 Center of an Object to be Transported, Loaded on the second Hand
L1 imaginary Line
L2 Line Connecting the Center of an Object to be Transported, Loaded on the First Hand, with the Center of Rotation
L3 Line Connecting the Center of an Object to be Transported, Loaded on the Second Hand, with the Center of Rotation
R Area

What is claimed is:

1. An industrial robot comprising:
a first hand and a second hand, both configured to transport objects loaded thereon;
an arm to which said first hand and said second hand are rotatably joined; and
a main unit which a base end portion of said arm is rotatable joined;
wherein a base end portion of said first hand and a base end portion of said second hand are joined to a front end portion of said arm;
wherein said first hand and said second hand are independently rotatable with respect to said arm and also rotatable about a common center of rotation with respect to said arm in the from a top-bottom direction;
wherein each of the first and second hands is formed being bent at a bending section in the view from the top-bottom direction;
wherein the first hand and second hand are formed to have line symmetry about a predetermined imaginary line passing through said center of rotation in the view from the top-bottom direction;
wherein the industrial robot is:
configured to take out said objects to be transported from a first arrangement location, in which said objects to be transported are stacked up in the top-bottom direction while a front end side of said first hand and a front end side of said second hand are overlapped with each other ire the top-bottom direction; and/or
configured to carry said objects to be transported into said first arrangement location while the front end side of said first hand and the front end side of said second hand are overlapped with each other the top-bottom direction;
wherein the industrial robot is:
configured to take out said objects to be transported from a second arrangement location, in which said objects to be transported are arranged so they are not overlapping with each other in the top-bottom direction while the front end side of said first hand and the front end side of said second hand are not overlapped with each other; and/or
configured to carry said objects to be transported into said second arrangement location while the front end side of said first hand and the front end side of said second hand are not overlapped with each other; and
wherein said first hand and said second hand are formed such that the front end side of said first hand and the front end side of said second hand are kept overlapped crossing over each other during a time of linearly transporting said objects to be transported with respect to said first arrangement location.

2. The industrial robot as set forth in claim 1;
wherein said first hand is formed being bent in one direction in the view from the top-bottom direction, and said second hand is formed being bent in a direction opposite from the bending direction of said first hand in the view from the top-bottom direction;
wherein the front end side of said first hand and the front end side of said second hand are forked to provide a first loading section and a second loading section respectively;

wherein, said first loading section of said first hand is positioned on a bending direction side of said first hand, and said second loading section of said second hand is positioned on a side opposite from a bending direction side of said second hand;

wherein said first loading section of said second hand is positioned on the bending direction side of said First hand, and said second loading section of said second hand is positioned on the side opposite the bending direction side of said second hand; and wherein said first hand and said second hand are formed such that a front end portion of said second loading section of said first hand and a front end portion of said second loading section of said second hand are overlapped with each other during the time of transporting said objects to be transported with respect to said first arrangement location.

3. The industrial robot as set forth in claim 1;

wherein said first hand and said second hand are formed such that a base end side of said first hand and a base end side of said second hand extend from said center of rotation in directions in which they part from each other, during a time of transporting said objects to be transported with respect to said second arrangement location.

4. The industrial robot as set forth in claim 3;

wherein said first hand and said second hand are formed such that the bending section of said first hand and the bending section of said second hand are positioned outside a triangle area bordered by a line connecting a center of said object to be transported when loaded on said First hand with said center of rotation and a line connecting the center of said object to be transported when loaded on said second hand with said center of rotation, during the time of transporting said objects to be transported with respect to said second arrangement location.

5. The industrial robot as set forth in claim 1;

wherein said first hand and said second hand are formed such that they are bent once at a predetermined angle in the view from the top-bottom direction.

6. The industrial robot as set forth in claim 5;

wherein a width of a front end side of said first hand is more uniform than that of its bending section, and a width of a front end side of said second hand is more uniform than that of its bending section.

* * * * *